United States Patent [19]

Nomura et al.

[11] Patent Number: 5,239,508
[45] Date of Patent: Aug. 24, 1993

[54] SEMICONDUCTOR MEMORY DEVICE HAVING A PLURALITY OF SELECTIVELY ACTIVATED DATA BUS LIMITERS

[75] Inventors: Hidenori Nomura; Yoshiharu Kato, both of Kasugai; Eisaku Itoh, Nagoya, all of Japan

[73] Assignees: Fujitsu Limited, Kanagawa; Fujitsu VLSI Limited, Aichi, both of Japan

[21] Appl. No.: 730,723

[22] Filed: Jul. 16, 1991

[30] Foreign Application Priority Data

Jul. 17, 1990 [JP] Japan ................................. 2-188381

[51] Int. Cl.$^5$ ............................................... G11C 7/00
[52] U.S. Cl. .......................... 365/189.06; 365/189.09; 365/204
[58] Field of Search ....................... 365/189.06, 189.09, 365/204

[56] References Cited

U.S. PATENT DOCUMENTS 4,829,479  5/1989  Mitsumoto et al. ............. 365/189.09
5,091,886  2/1992  Miyawaki et al. .......... 365/189.06 X

FOREIGN PATENT DOCUMENTS

0235889  9/1987  European Pat. Off. .
0262531  4/1988  European Pat. Off. .
64-19582  1/1989  Japan .

Primary Examiner—Siegfried H. Grimm
Attorney, Agent, or Firm—Nikaido, Marmelstein, Murray & Oram

[57] ABSTRACT

A semiconductor memory device comprises a memory cell array including a plurality of memory cells, a plurality of word lines and bit lines connected to the memory cells, a data bus for carrying data to be written in and/or read out from a selected memory cell, an addressing circuit for selecting one of the word lines and bit lines, an input buffer for outputting the electric signal indicative of the data to be written on the data bus, a current-mirror amplifier connected to the data bus for amplifying the electric signals that are read out from the memory cell on the data bus, and a limiter circuit connected to the data bus for limiting a voltage swing of the electric signals on the data bus. The limiter circuit maintains the data bus at a predetermined voltage level and limits the voltage level of the electric signals supplied to the current-mirror amplifier, wherein the limiter circuit changes the predetermined voltage level in response to a voltage level of a supply voltage that powers the current-mirror amplifier.

11 Claims, 9 Drawing Sheets

SEMICONDUCTOR MEMORY DEVICE HAVING A PLURALITY OF SELECTIVELY ACTIVATED DATA BUS LIMITERS

BACKGROUND OF THE INVENTION

The present invention generally relates to semiconductor memory devices and more particularly to a semiconductor memory device having a current-mirror type amplifier for amplifying data outputted on a data bus.

Semiconductor memory devices generally have a memory cell array in which a number of memory cell transistors are arranged in rows and columns. In correspondence to each memory cell transistor, there is provided a memory cell capacitor for storing binary data in the form of electric charges. The memory cell transistors are connected to word lines extending in a row direction and bit lines extending in a column direction, and addressing of the memory cell is made by selecting one of the word lines and one of the bit lines.

When writing data, the data to be written is supplied to a bit line and transferred to a selected memory cell capacitor via a memory cell transistor by energizing a selected word line simultaneously. When reading data, on the other hand, the electric charges accumulated in a memory cell capacitor are transferred to a selected bit line via a memory cell transistor by energizing a selected word line. The minute change of voltage level thus induced on the bit line is detected and amplified by a sense amplifier.

In such semiconductor memory devices, various efforts are made to increase the speed of reading and writing. Among others, there is a technique to increase the speed of reading by amplifying the electric signals obtained on the bit line after amplification by a sense amplifier.

Figure 1:
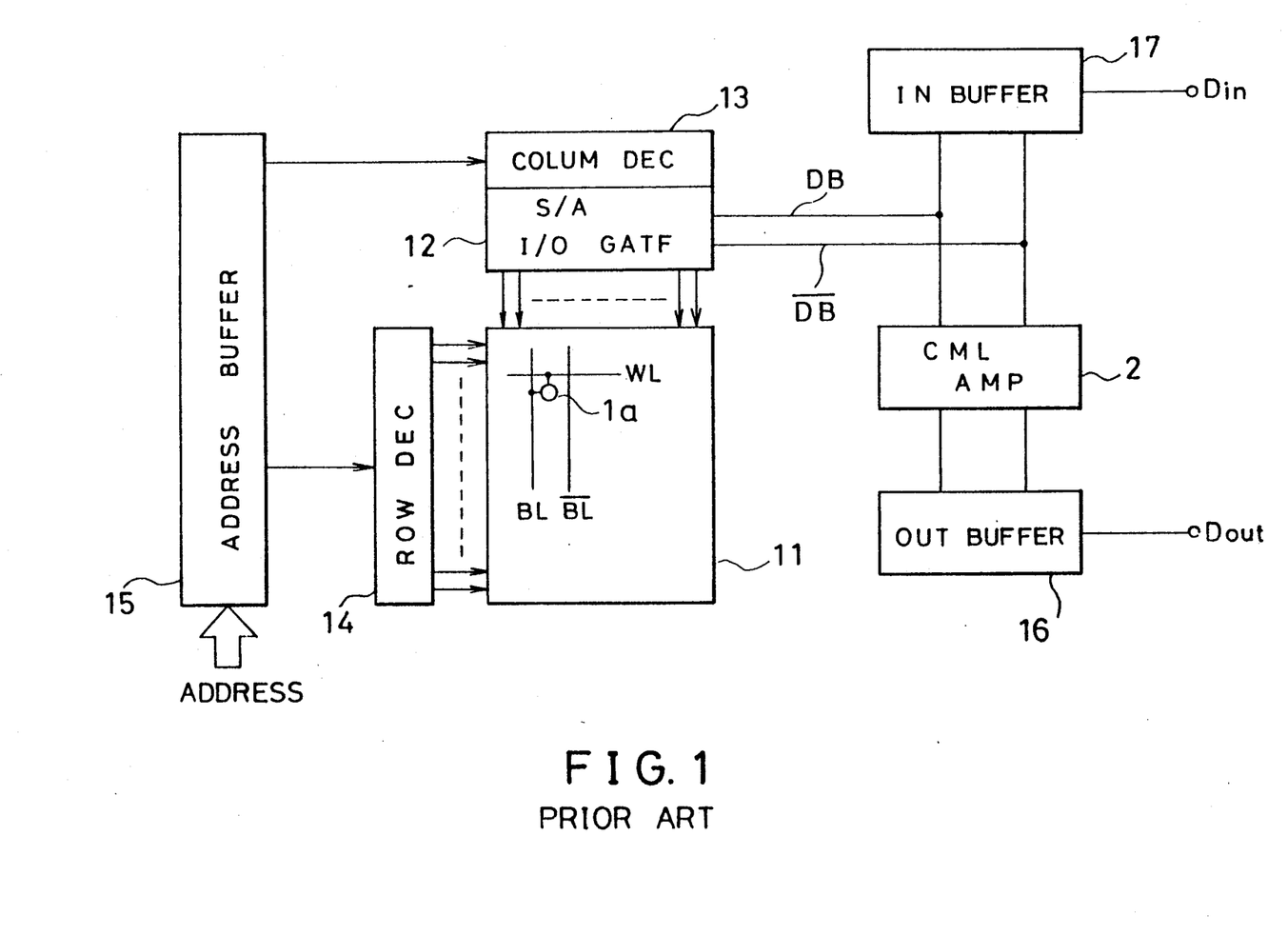
FIG. 1 is a block diagram showing the overall construction of a conventional semiconductor memory device that uses a current-mirror amplifier for accelerating the speed of reading.

FIG. 1 shows a conventional semiconductor memory device that employs the foregoing construction for increasing the speed of reading.

Referring to FIG. 1, the semiconductor memory device includes a memory cell array 11 in which a number of memory cells 1a are arranged in rows and columns. Each memory cell 1a is connected to a pair of complementary bit lines BL, $\overline{BL}$ and a word line WL, wherein the bit lines are selectively enabled by a row decoder 14. The word lines, on the other hand, are enabled by a column decoder 13. Further, the column decoder 13 and the row decoder 14 are driven by an address buffer 15 that supplies a column selection signal to the column decoder 13 and a row selection signal to the row decoder 14 in response to address data ADDRESS supplied thereto.

To write data to the memory cell 1a in the memory cell array 11, an input buffer circuit 17 is used. The input buffer circuit 17 is supplied with input data Din and supplies the same to a complementary data bus line pair DB, $\overline{DB}$ in the form of complementary electric signals. The bus lines DB and $\overline{DB}$ are connected to the bit lines BL and $\overline{BL}$ via an input/output gate 12. The column decoder 13 controls the input/output gate 12 in response to the column selection signal supplied thereto, and the complementary electric signals on the data bus lines DB and $\overline{DB}$ are transferred to the selected bit line pair BL and $\overline{BL}$. Thereby, the electric signals on the data bus lines DB and $\overline{DB}$ are transferred to the selected bit line pair BL and $\overline{BL}$. Further, by selectively energizing the word line WL simultaneously, the electric signals on the selected bit line pair BL and $\overline{BL}$ are transferred to the memory cell 1a and stored therein in the form of electric charges.

When reading data, the row decoder 14 energizes a selected word line WL. Thereby, the memory cells connected to the selected word line WL transfer the electric charges stored therein to the respective bit line pairs BL, $\overline{BL}$, and the minute voltage change caused in the bit lines is detected by a sense amplifier shown in FIG. 1 by the block 12 that is the same block for the input/output gate. The sense amplifier 12 supplies the output to the bit line pair BL and $\overline{BL}$, and the electric voltages thus produced on a selected bit line pair are supplied to the complementary data bus DB, $\overline{DB}$ via the input/output gate 12. The voltage signals thus obtained on the data bus lines DB, $\overline{DB}$ are then outputted by an output buffer circuit 16 as output data Dout.

In order to accelerate the reading, there is provided a current-mirror type amplifier 2 between the data bus and the output buffer circuit 16 for amplifying the electric signals on the data bus DB, $\overline{DB}$. By amplifying the level of the complementary signals on the data bus, the current mirror amplifier 2 enables a quick discrimination of the logic state of the data read from the memory cell 1a.

Figure 2:
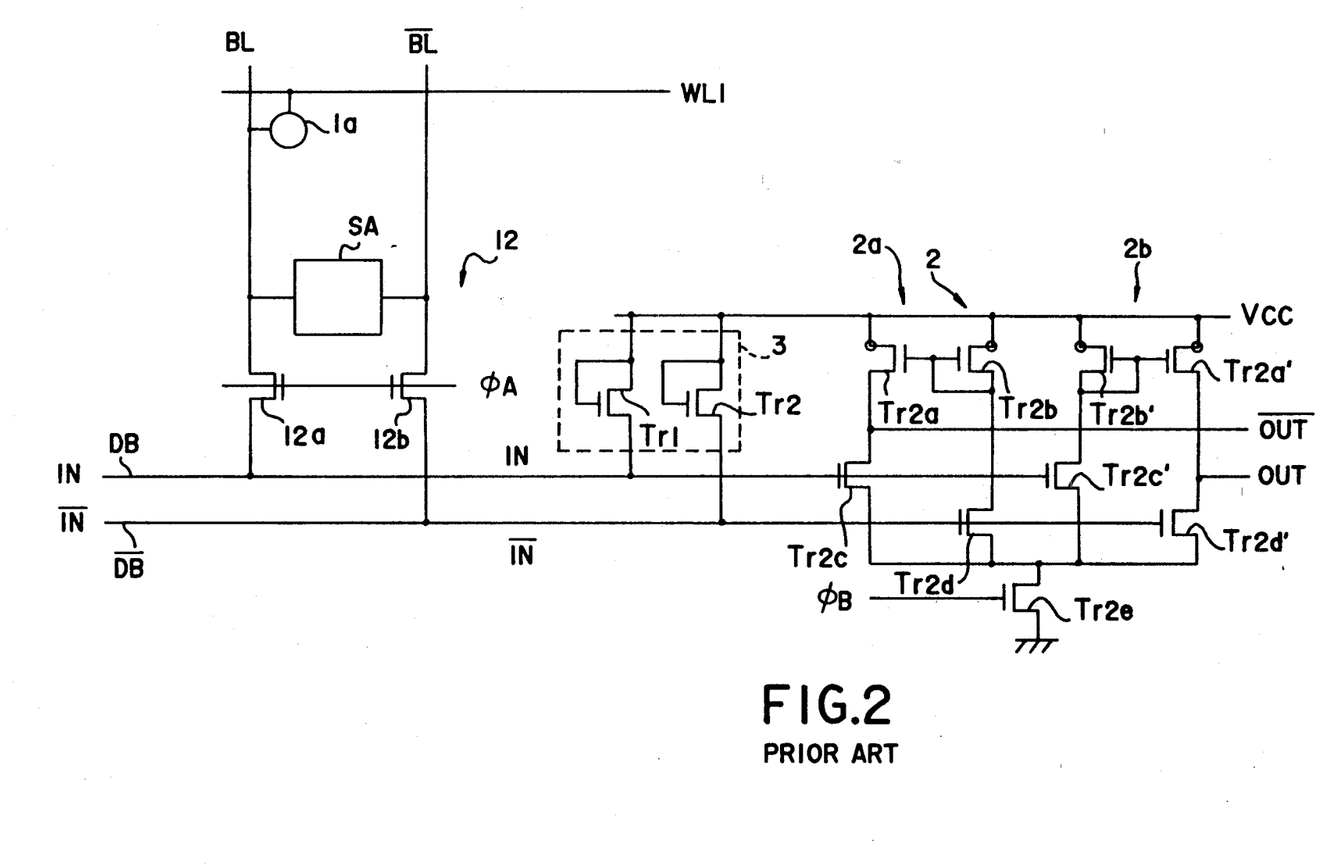
FIG. 2 is a block diagram showing a relevant part of the block diagram of FIG. 1 that includes the current-mirror amplifier.

FIG. 2 shows a conventional current-mirror amplifier circuit together with a part of the memory cell array 11.

Referring to FIG. 2, the sense amplifier represented by SA in the drawing is provided in correspondence to each bit line pair BL and $\overline{BL}$. Further, the bit lines BL and $\overline{BL}$ are connected respectively to the lines DB and $\overline{DB}$ of the data bus via transistors 12a and 12b forming the input/output gate 12. The transistors 12a and 12b are turned on in response to the high level state of the column selection signal represented as $\phi_A$ FIG. 2 and connect the bit lines to the corresponding lines of the data bus.

The electric signals thus transferred to the bus lines DB and $\overline{DB}$ are then passed through a limiter circuit 3. The limiter circuit 3 includes a first transistor Tr1 connected between a power supply line Vcc and the bit line BL and a second transistor Tr2 connected between the power supply line Vcc and the bit line $\overline{BL}$. Each of the transistors Tr1 and Tr2 has a gate and a source connected with each other and is maintained always at the turned-on state. Thereby, a voltage drop corresponding to the threshold voltage of the transistors appears at the drain of the transistors, and the voltage of the data bus DB, $\overline{DB}$ is held at the level of Vcc−VthN, where VthN represents the threshold level of the transistors Tr1 and Tr2. For example, the voltage level of the data bus may be held at 4 volts, assuming the supply voltage Vcc of 5 volts and the threshold voltage VthN of 1 volt.

When there occurs a transfer of the electric signals from the bit lines BL and $\overline{BL}$ to the data bus lines DB and $\overline{DB}$ in response to the high level state of the column selection signal $\phi_A$, the voltage level of the data bus DB, $\overline{DB}$ changes about the foregoing level of 4 volts, and this voltage change is detected by the current-mirror amplifier 2.

The current-mirror amplifier 2 includes two current-mirror amplifier circuits 2a and 2b having a similar construction, wherein the circuit 2a has a usual construction having a pair of P-channel MOSFETs Tr2a and Tr2b with respective gates connected with each other and respective drains connected commonly to the power supply line Vcc. As usual, the gate of the transistor Tr2b is connected to the source of the same transistor Tr2b. Further, the transistors Tr2a and Tr2b have respective sources connected to a source of an N-channel MOSFET Tr2c and a source of another N-channel MOSFET Tr2d. The transistor Tr2c in turn has a gate connected to the data bus line DB and a drain connected to a source of still other N-channel MOSFET Tr2e, while the transistor Tr2d has a gate connected to the data bus line $\overline{DB}$ and a drain connected to the source of the transistor Tr2e commonly to the drain of the transistor Tr2c. The transistor Tr2e has a gate to which an enable signal $\phi_B$ is supplied and a drain connected to the ground.

In operation of the circuit 2a, the transistor Tr2e is enabled in response to the enable signal $\phi_B$. Further, the transistors Tr2c and Tr2d are supplied with the complementary input signals IN on the line DB and $\overline{IN}$ on the line $\overline{DB}$. Thereby, the transistors Tr2c and Tr2d are caused to turn on and turn off in the complementary manner. As will be remarked later, the transistors Tr2c and Tr2d are not completely turned on or turned off in the foregoing operation.

In the current mirror amplifier 2a, an output current flows through the transistor Tr2a when a current flows through the transistor Tr2b such that the magnitude of the output current through the transistor Tr2a is equal to the magnitude of the current through the transistor Tr2b. The current through the transistor Tr2b will be referred to as the reference current. Thus, when the transistor Tr2d is turned on in response to the high level state of the complementary input signal $\overline{IN}$ on the data bus line $\overline{DB}$, the reference current flows through the transistor Tr2b and an output current flows through the transistor Tr2a accordingly. As the transistor Tr2c is in the turned-off state in response to the low level state of the input signal IN on the data bus line DB, the output current flowing through the transistor Tr2a is mostly diverted to an output bus OUT that is connected to the source of the transistor Tr2c. Thereby, the voltage level of the bus OUT increases to a level close to Vcc.

The other current-mirror amplifier 2b has a similar construction except that the transistors Tr2a and Tr2b are reversed. Thus, a transistor Tr2b' that corresponds to the transistor Tr2b and having a gate and a source connected with each other, is connected in series to a transistor Tr2c' that corresponds to the transistor Tr2c and having a gate to which the input signal IN is supplied from the data bus line DB. Similarly, a transistor Tr2a' corresponding to the transistor Tr2a is connected in series to a transistor Tr2d'. Further, a complementary output bus $\overline{OUT}$ is connected to the source of the transistor Tr2d'.

Thus, in the previous case where the transistor Tr2d is turned on and the output current supplied to the output bus OUT via the transistor Tr2a, only small current flows through the transistor Tr2a' in correspondence to the turning-off of the transistor Tr2c' that in turn is caused simultaneously to the turning-off of the transistor Tr2c. Further, the transistor Tr2d' is turned on simultaneously to the turning-on of the transistor Tr2d and the voltage level on the output bus $\overline{OUT}$ becomes low. In other words, a small output current is obtained on the bus $\overline{OUT}$ and the voltage level on the bus $\overline{OUT}$ approaches to zero. In the case where the input signal IN on the bus DB has the high level state, on the other hand, an output current is obtained on the bus $\overline{OUT}$ while only a small output current is obtained on the bus OUT. Thus, the level of the output bus OUT approaches to zero while the level of the bus $\overline{OUT}$ approaches to Vcc.

Figure 3:
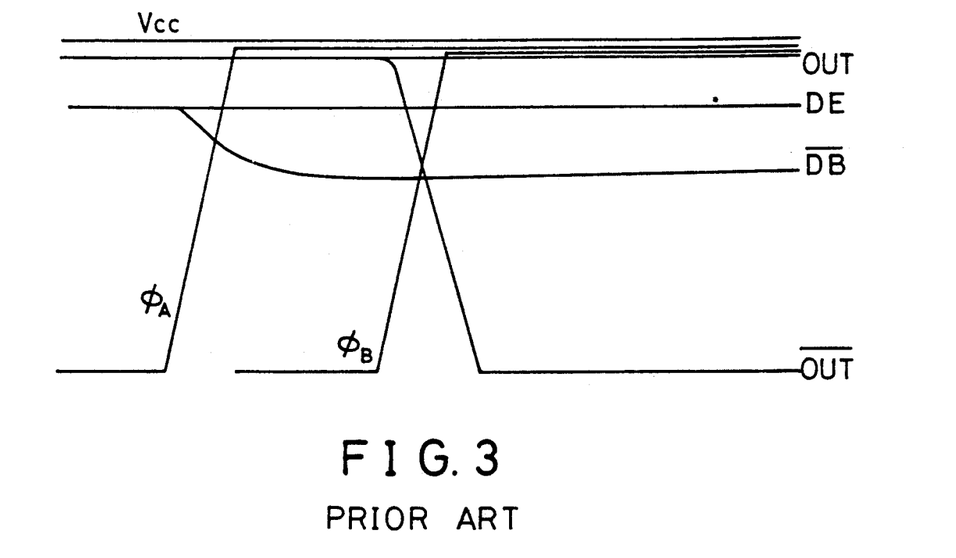
FIG. 3 is a diagram showing the operation of the current-mirror amplifier shown in the block diagram of FIG. 2.

FIG. 3 shows the reading operation of the semiconductor memory device of FIG. 1 wherein the circuit of FIG. 2 is used.

Referring to FIG. 3, the column selection signal $\phi_A$ rises first in response to the selection of the bit line pair BL and $\overline{BL}$. In response to the rising of the signal $\phi_A$, the electric signals on the selected bit line pair are transferred to the data bus DB, $\overline{DB}$ as illustrated. Next, the activation signal $\phi_B$ is supplied as illustrated, and the current-mirror circuit 2 produces the output signals on the output bus OUT, $\overline{OUT}$, wherein the level of the bus $\overline{OUT}$ is lowered with respect to the level of the bus OUT.

It should be noted that, in the foregoing operation of the current-mirror amplifier, the transistors Tr2c and Tr2d are not completely turned on or turned off even when the level of the signals on the bus lines DB and $\overline{DB}$ has changed to the high level or low level. By setting the operation of the current-mirror amplifier 2 as such, one can reduce the time needed to turn over of the logic state of the output signals on the output bus OUT, $\overline{OUT}$.

In order to achieve the foregoing optimum operation, the data bus lines DB and $\overline{DB}$ are biased by the limiter circuit 3 at a predetermined level that is determined by the threshold voltage of the transistors Tr1 and Tr2. Thereby, the limiter circuit 3 limits the voltage swing of the signals IN and $\overline{IN}$ on the data bus DB, $\overline{DB}$ such that the transistors Tr2c and Tr2d are not completely turned on or turned off. The optimum operational point of the current-mirror amplifier 2 is determined based upon various factors such as the speed of reading and the gain of amplification. For example, the current-mirror amplifier circuit 2 provides the highest speed and gain when the data bus lines DB and $\overline{DB}$ are biased at the level Vcc/2.

Figure 4:
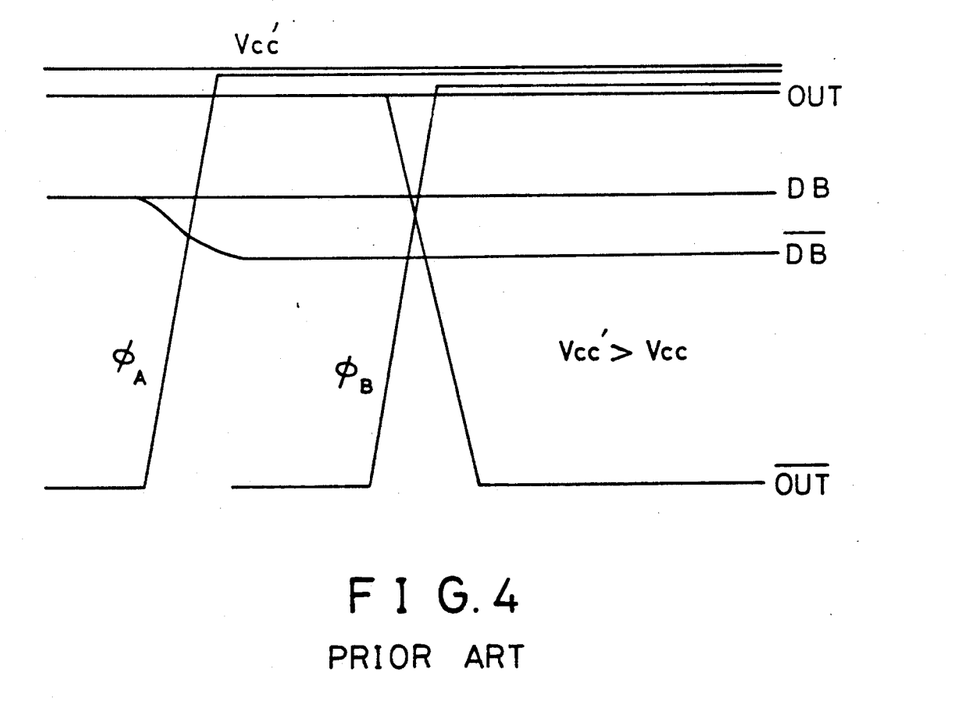
FIG. 4 is a diagram showing the operation of the current-mirror amplifier in the state where the voltage level of the supply voltage is increased.

In the foregoing conventional circuit of FIG. 2 where only a single transistor is used between the supply voltage line and either bus lines, the data bus lines DB and $\overline{DB}$ are biased inevitably at the level of about 4 volts, assuming the threshold voltage of 1 volt. In such a case, therefore, the current mirror circuit 2 is not optimized with respect to the speed and gain. Particularly, when the level of the voltage Vcc is increased to Vcc' as shown in FIG. 4, the speed and gain of the current-mirror amplifier is deteriorated further. It should be noted that the data bus lines DB and $\overline{DB}$ are biased at relatively high voltage level of 4 volts. Thus, when there is a voltage increase of 1 volt in the supply voltage Vcc, the biasing level of the data bus lines DB and $\overline{DB}$ will increase from 4 volts to 5 volts. Thereby, the deviation in the operational point from the optimum level of Vcc/2 increases further.

Figure 5:
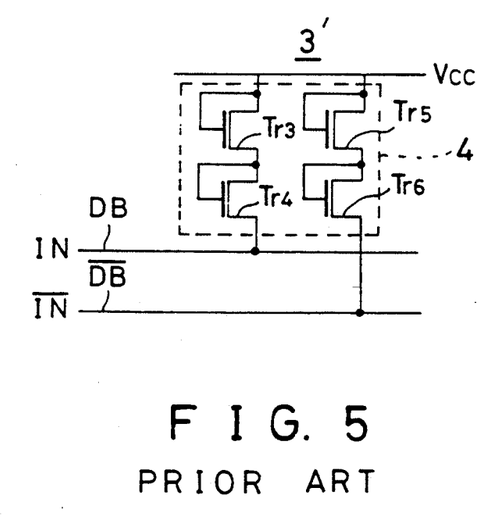
FIG. 5 is a circuit diagram showing a construction of a limiter circuit used in combination with the current-mirror amplifier for optimizing the operation of the current-mirror amplifier.

FIG. 5 shows a conventional construction to optimize the operation of the current-mirror amplifier.

Referring to FIG. 5, a limiter circuit 3' is used in place of the limiter circuit 3, in which transistors Tr3 and Tr4 are connected in series and interposed between the power supply line Vcc and the data bus DB line. Similarly, transistors Tr5 and Tr6 are connected in series and interposed between the power supply line Vcc and the data bus $\overline{DB}$ line. In this construction, the voltage drop caused by the limiter circuit 3' becomes about 2 volts.

Figure 6:
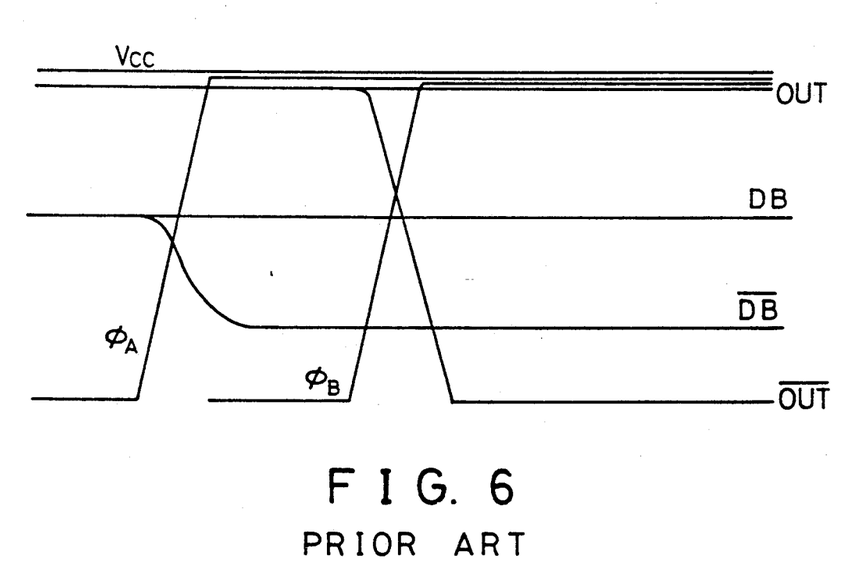
FIG. 6 is a diagram showing the operation of the current-mirror circuit in combination with the limiter circuit of FIG. 5.

FIG. 6 shows the operation of the semiconductor memory device of FIG. 1 in which the limiter circuit 3' is used in place of the limiter circuit 3. As can be seen in this drawing, the data bus DB, $\overline{DB}$ is biased at about 3 volts assuming the threshold voltage VthN of 1 volt, and an optimum amplification is achieved in the current-mirror amplifier 2, with respect to the speed and gain.

This conventional construction, however, has a problem of unreliable operation of the current-mirror amplifier. More specifically, when there is a voltage drop in the supply voltage Vcc, there is a risk that the voltage level of the data bus DB, $\overline{DB}$ decreases excessively. For example, when the supply voltage Vcc is decreased to about 4 volts, the biasing level of the data bus decreases to about 2 volts. Thereby, there is a substantial risk that the current-mirror amplifier 2 does not operate when the signals IN and $\overline{IN}$ are supplied to the respective bus lines DB and $\overline{DB}$. It should be noted that such a voltage drop or negative voltage bump of the supply voltage Vcc tends to occur relatively often, for example at the time of reading data where the sense amplifiers SA are activated. It should be noted that the sense amplifiers SA for the entire memory cell columns are activated simultaneously when reading data.

The foregoing construction of FIG. 5, using the series connection of the MOS transistors Tr3 and Tr4 or Tr5 and Tr6 in the limiter circuit 3', has another problem of increased variation in the biasing level of the bus lines. It should be noted that the biasing level of the bus lines DB and $\overline{DB}$ is determined by the sum of the threshold voltage of the transistors that are connected in series, while there is a substantial scattering in the threshold voltage VthN in the MOS transistors that are available at present. Thereby, the variation in the biasing level is further enhanced. In the circuit 3', therefore, the risk of the current-mirror amplifier 2 becoming inoperational due to the momentary drop of the supply voltage Vcc may be enhanced because of the increased scattering of the bias voltage.

SUMMARY OF THE INVENTION

Accordingly, it is a general object of the present invention to provide a novel and useful semiconductor memory device, wherein the foregoing problems are eliminated.

Another and more specific object of the present invention is to provide a semiconductor memory device having a current-mirror amplifier for amplification of electric signals that are read on a data bus, wherein the current-mirror amplifier is capable of operating at a high speed and high reliability even when there is a substantial variation in the power voltage level.

Another object of the present invention is to provide a semiconductor memory device having a current-mirror amplifier for amplification of electric signals outputted on a data bus, after amplitude limitation by a limiter circuit, wherein the limiter circuit comprises a plurality of circuit parts each biasing the data bus at a predetermined level that is different in each limiter circuit, and wherein there is provided a selector circuit for selecting one of the circuit parts in response to the level of the supply voltage. According to the present invention, the operation of the current-mirror amplifier is optimized even when there is a variation in the supply voltage by adaptively changing the bias voltage level of the data bus. Thereby, the foregoing object of providing the semiconductor memory device that operates at high speed and high reliability even when there is a variation in the supply voltage, is successfully achieved.

Other objects and further features of the present invention will become apparent from the following detailed description when read in conjunction with the attached drawings.

DETAILED DESCRIPTION

Figure 7:
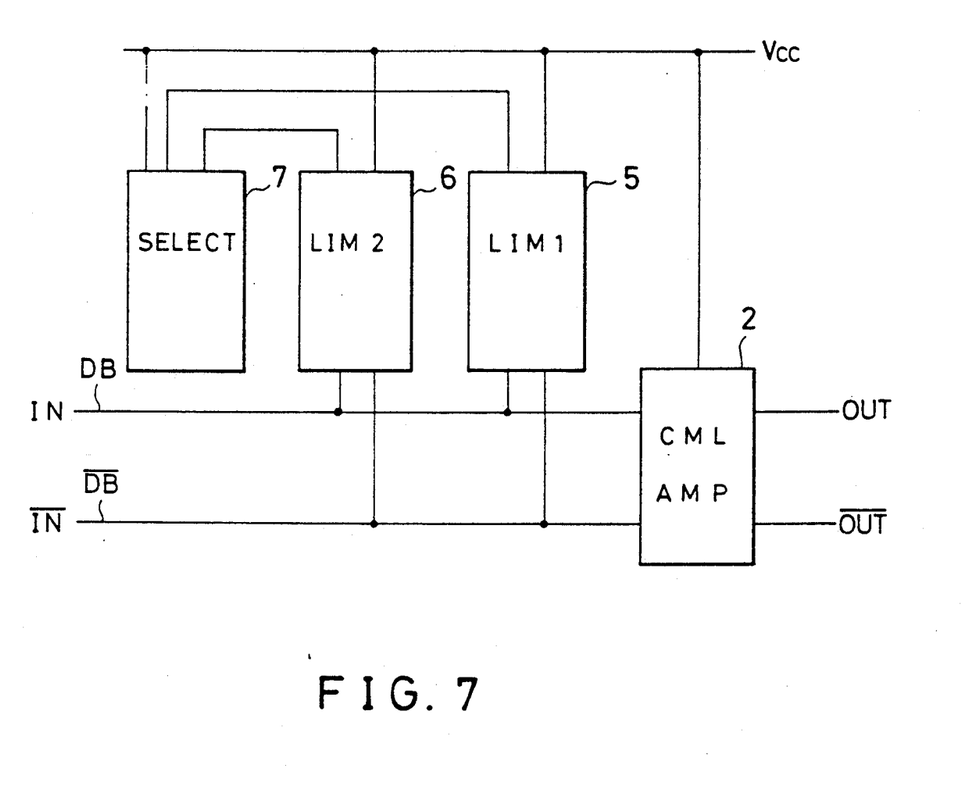
FIG. 7 is a block diagram showing the principle of the present invention.

FIG. 7 shows the principle of the present invention.

Referring to FIG. 7, the electric signals IN and $\overline{IN}$, respectively outputted on the data bus lines DB and $\overline{DB}$ in response to the selection of a memory cell, are supplied to the current mirror amplifier 2 for amplification. To the data bus DB, $\overline{DB}$, a plurality of limiter circuits 5 and 6 are connected for limiting the amplitude of the signals IN and $\overline{IN}$. The limiter circuits 5 and 6 bias the data bus, when activated, at respective levels, and a selector circuit 7 is provided to activate one of the limiter circuits 5 and 6 selectively in response to the supply voltage Vcc.

Figure 8:
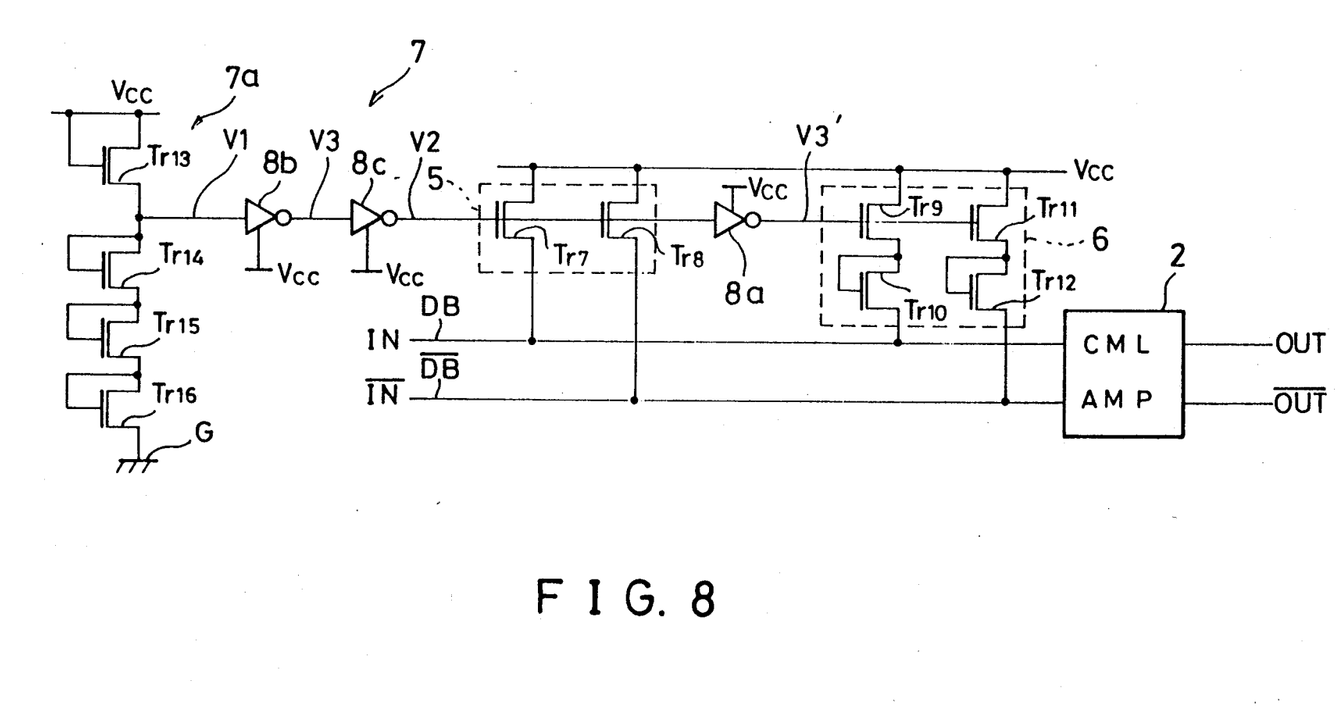
FIG. 8 is a circuit diagram showing a first embodiment of the present invention.

FIG. 8 shows a first embodiment of the present invention.

Referring to FIG. 8, the limiter circuit 5 includes MOS transistors Tr7 and Tr8 respectively connected between the supply voltage line Vcc and the data bus DB and between the supply voltage line Vcc and the data bus $\overline{DB}$. Thus, the limiter circuit 5 has a construction similar to the limiter circuit 3 except that the transistors Tr7 and Tr8 are no longer held in the turned-on state. Only when there is a high level signal at the gate, the transistors Tr7 and Tr8 are turned on and cause a voltage drop of VthN between the power line Vcc and the data bus line DB or $\overline{DB}$.

On the other hand, the limiter circuit 6 includes MOS transistors Tr9, Tr10, Tr11 and Tr12, wherein the MOS transistors Tr9 and Tr10 are connected in series and interposed between the power supply line Vcc and the data bus line DB, the MOS transistors Tr11 and Tr12 are connected in series and interposed between the power supply line Vcc and the data bus line $\overline{\text{DB}}$. Thereby, a voltage drop corresponding to 2VthN is induced between the power supply line Vcc and the data bus line DB or $\overline{\text{DB}}$ when the transistors Tr9 and Tr11 are activated in response to a high level signal supplied to the gate of these transistors.

In order to activate the limiter circuits 5 and 6 selectively, the selector circuit 7 supplies the activation signal to the gate of the transistors Tr7, Tr8, Tr9 and Tr11, wherein the level of the activation signal to the transistors Tr9 and Tr11 is inverted by an inverter 8a. The selector circuit 7 includes MOS transistors Tr13-Tr16 connected in series, wherein the gate and source are shorted in each transistor to drive the transistors Tr13-Tr16 always in the turned-on state. The output activation signal is obtained at the node connecting the drain of the transistor Tr13 and the source of the transistor Tr14, and is supplied to the gate of the transistors Tr7 and Tr8 after inversion by inverters 8b and 8c.

Figure 9:
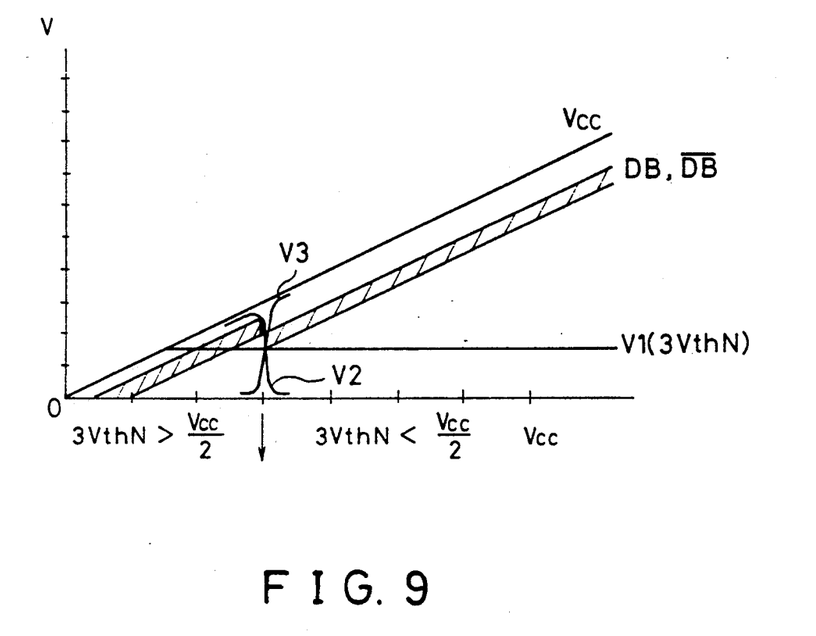
FIG. 9 is a diagram showing the operation of the circuit of FIG. 8.

FIG. 9 shows the operation of the semiconductor memory device of FIG. 1 in which the limiter circuits 5 and 6 are used together with the selector circuit 7, in place of the conventional limiter circuit 3 or 3'.

Referring to FIG. 9 showing the voltage level of various nodes in the circuit of FIG. 8 as a function of the supply voltage Vcc, the voltage V1 appearing at the source of the transistor Tr14 and supplied to the inverter 8b increases with increasing supply voltage Vcc when the voltage Vcc is increased from zero volt. When the voltage Vcc has exceeded a predetermined level, the voltage V1 is held constant at a level of three times the threshold voltage Vth of the transistors Tr13-Tr16 (3Vth).

This voltage V1 is supplied to the inverter 8b that operates upon reception of the supply voltage Vcc. The inverter 8b includes a P-channel MOS transistor and an N-channel MOS transistor connected in series as usual, and has a threshold level of inversion operation at V=Vcc/2. Thus, in the case when the supply voltage Vcc divided by two (Vcc/2) is lower than the voltage V1(3Vth>Vcc/2,V1=3Vth), the inverter 8b produces a low level output V3 shown in FIG. 9, while when the supply voltage Vcc has increased to a level that satisfies a condition 3Vth<Vcc/2, the inverter 8b produces a high level output and the level of the output signal V2 changes to the high level state.

The output signal V3 of the inverter 8b is then supplied to the inverter 8c for logic level inversion, and the output signal V2 of the inverter 8c is supplied to the gate of the transistors Tr7 and Tr8 of the limiter circuit 5. Further, the output signal V2 is passed through the inverter 8a that produces an output signal V3' corresponding to the logic level inversion of the signal V2. The signal V3' thus produced is then supplied to the gate of the transistors Tr9 and Tr11 of the second limiter circuit 6 for activating the same. Thus, when the logic level of the signal V2 is high, the limiter circuit 5 is activated while the limiter circuit 6 is deactivated. On the other hand, when the logic level of the signal V2 is low, the limiter circuit 5 is deactivated while the limiter circuit 6 is activated. In other words, the activation of the limiter circuits 5 and 6 is made selectively in response to the variation of the supply voltage Vcc.

Figure 10:
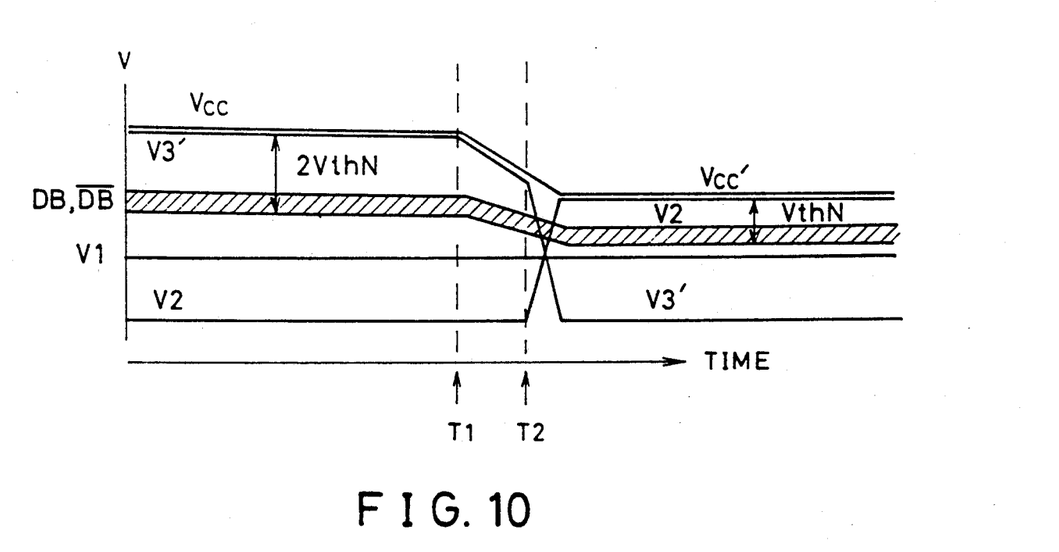
FIG. 10 is another diagram showing the operation of the circuit of FIG. 8.

FIG. 10 shows the transitional operation of the circuit of FIG. 8 wherein there is a voltage bump in the supply voltage Vcc.

Referring to FIG. 10, the supply voltage is at Vcc at the beginning, and the data bus lines DB and $\overline{\text{DB}}$ are biased by the limiter circuit 6 at a level lower than Vcc by 2VthN, where VthN is the threshold voltage of the transistors Tr9-Tr12 of the circuit 6. It should be noted that the level of the output signal V3' of the inverter 8a is high in this state and the limiter circuit 6 is activated. On the other hand, the level of the output signal V2 of the inverter 8c is low and the limiter circuit 5 is not activated.

When there is a voltage bump or drop at a time T1 in the supply voltage Vcc, the voltage V3' starts to decrease simultaneously. When the voltage Vcc has become smaller than twice the voltage V1 (Vcc<2V1 or Vcc/2<V1) at a time T2, on the other hand, the output voltage V2 of the inverter 8c starts to rise while the output voltage V3' of the inverter starts to fall. Thereby, the limiter circuit 5 is activated and the limiter circuit 6 is deactivated. In response to this, the data bus lines DB and $\overline{\text{DB}}$ are biased at a level lower than the supply voltage Vcc by VthN. When there is an increase in the supply voltage Vcc, on the other hand, the limiter circuit 6 is activated while the limiter circuit 5 is deactivated. Thereby, the operation of the current-mirror amplifier 2 is optimized. As the operation of the circuit of FIG. 8 for this case is obvious from the foregoing description, further description will be omitted.

Thus, the circuit of FIG. 8 adaptively controls the biasing level of the data bus when there is a voltage change in the supply voltage Vcc, and the operation of the current-mirror amplifier 2 is optimized irrespective of the variation of the supply voltage Vcc. For example, when there is a voltage increase in the supply voltage Vcc, the limiter circuit 6 is selected and the biasing level of the data buses DB and $\overline{\text{DB}}$ is set at Vcc−2VthN, while when there is a voltage drop in the supply voltage Vcc, the limiter circuit 5 is selected and the biasing level of the data bus lines DB and $\overline{\text{DB}}$ is set to Vcc-VthN. Thereby, the current-mirror amplifier 2 is operated close to the optimum operational point.

Figure 11:
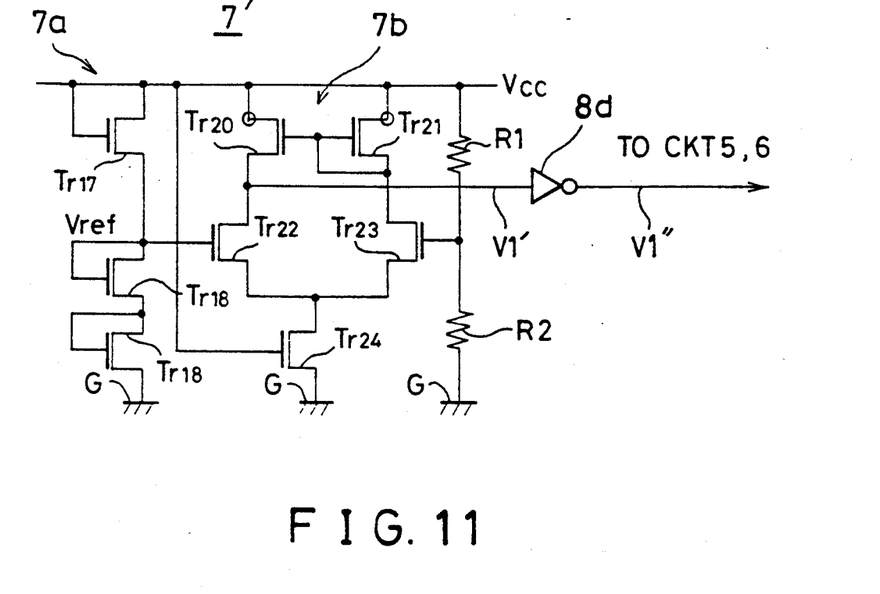
FIG. 11 is a circuit diagram showing an embodiment of the selector circuit of FIG. 7.

FIG. 11 shows another embodiment of the selector circuit 7.

Referring to FIG. 11 showing a selector circuit 7', the circuit 7' comprises a reference voltage generation part 7a for producing a constant, reference voltage Vref, and a comparator circuit 7b supplied on the one hand with a reference voltage Vref and on the other hand with the supply voltage Vcc divided by two (Vcc/2) as a sample voltage. Thereby, the comparator circuit 7b produces a high level output when the level of the sample voltage Vcc/2 has exceeded the reference voltage Vref, while when the level of the sample voltage Vcc/2 has decreased below the reference voltage Vref, the comparator circuit 7b produces a low level output. The output voltage of the comparator circuit 7b is supplied to limiter circuits 5 and 6 after logic level inversion in an inverter 8d.

The reference voltage generation part 7a includes MOSFETs Tr17, Tr18 and Tr19 connected in series between the supply voltage Vcc and the ground G, wherein each transistor has its gate and source shorted with each other and operated in the fully tuned-on state. Thereby, a voltage of 2Vth is obtained as the reference voltage Vref, where Vth is the threshold voltage of the transistors Tr17–Tr19.

The comparator circuit 7b, on the other hand, has a current-mirror construction similar to the current-mirror amplifier 2, wherein P-channel MOS transistors Tr20 and Tr21 are provided such that respective gates thereof are connected commonly with each other and respective drains are connected commonly to the supply voltage line Vcc. Further, N-channel MOSFETs Tr22 and Tr23 are provided respectively in series to the transistors Tr20 and Tr21, and the transistors Tr22 and Tr23 are connected in series to another N-channel MOSFET Tr24 that has a drain connected to the ground G. Thus, the source of the transistor Tr20 is connected to the source of the transistor 22, and the source of the transistor Tr21 is connected to the source of the transistor Tr23. Further, respective drains of the transistors Tr22 and Tr23 are connected commonly to a source of the transistor Tr24. The transistor Tr24 has a gate that is biased by the voltage Vcc and, is held always in the turned-on state.

The foregoing reference voltage Vref is supplied to a gate of the transistor Tr22, while the sampling voltage Vcc/2 is supplied to a gate of the transistor Tr23. It should be noted that a voltage divider comprising resistors R1 and R2 connected in series, is provided between the supply voltage line Vcc and the ground G and produces the sampling voltage Vcc/2.

Figure 12:
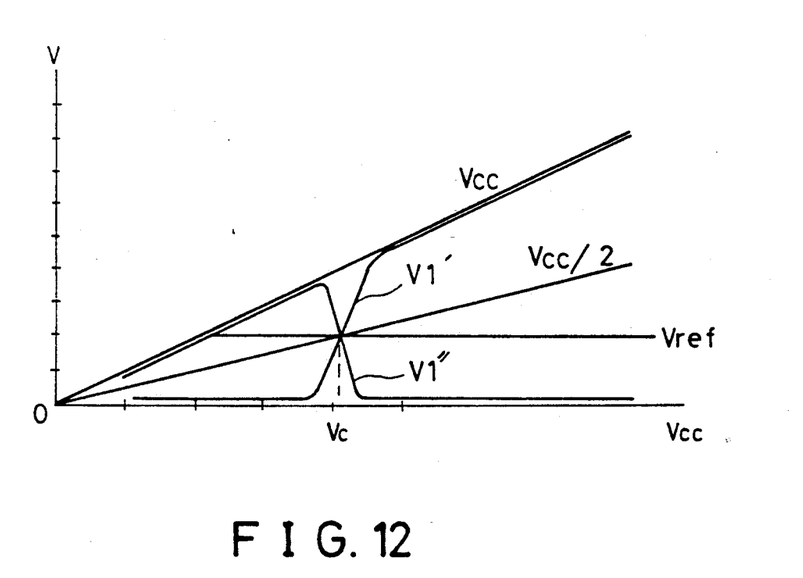
FIG. 12 is a diagram showing the operation of the circuit of FIG. 11.

FIG. 12 shows the operation of the semiconductor memory device of the present invention, wherein the selector circuit 7' is used in the circuit of FIG. 8.

Referring to FIG. 12, the sample voltage Vcc/2 increases with increasing supply voltage Vcc and crosses the reference voltage Vref at Vcc=Vc. In response to this, the output voltage V1' of the comparator circuit 7b starts to rise and the output voltage V1" of the inverter 8d starts to fall. In other words, the logic level of the output signal V1" of the inverter 8d reflects the level of the supply voltage Vcc, and this signal V1" is supplied to the gate of the transistors Tr7 and Tr8 of the limiter circuit 5 of FIG. 8, in place of the signal V2. Further, the signal V1" is supplied to the gate of the transistors Tr9 and Tr11 of the limiter circuit 6 after logic level inversion in the inverter 8a. Thereby, the biasing level of the data bus lines DB and $\overline{DB}$ is changed similar to FIG. 10 in response to the change in the level of the supply voltage Vcc.

Figure 13:
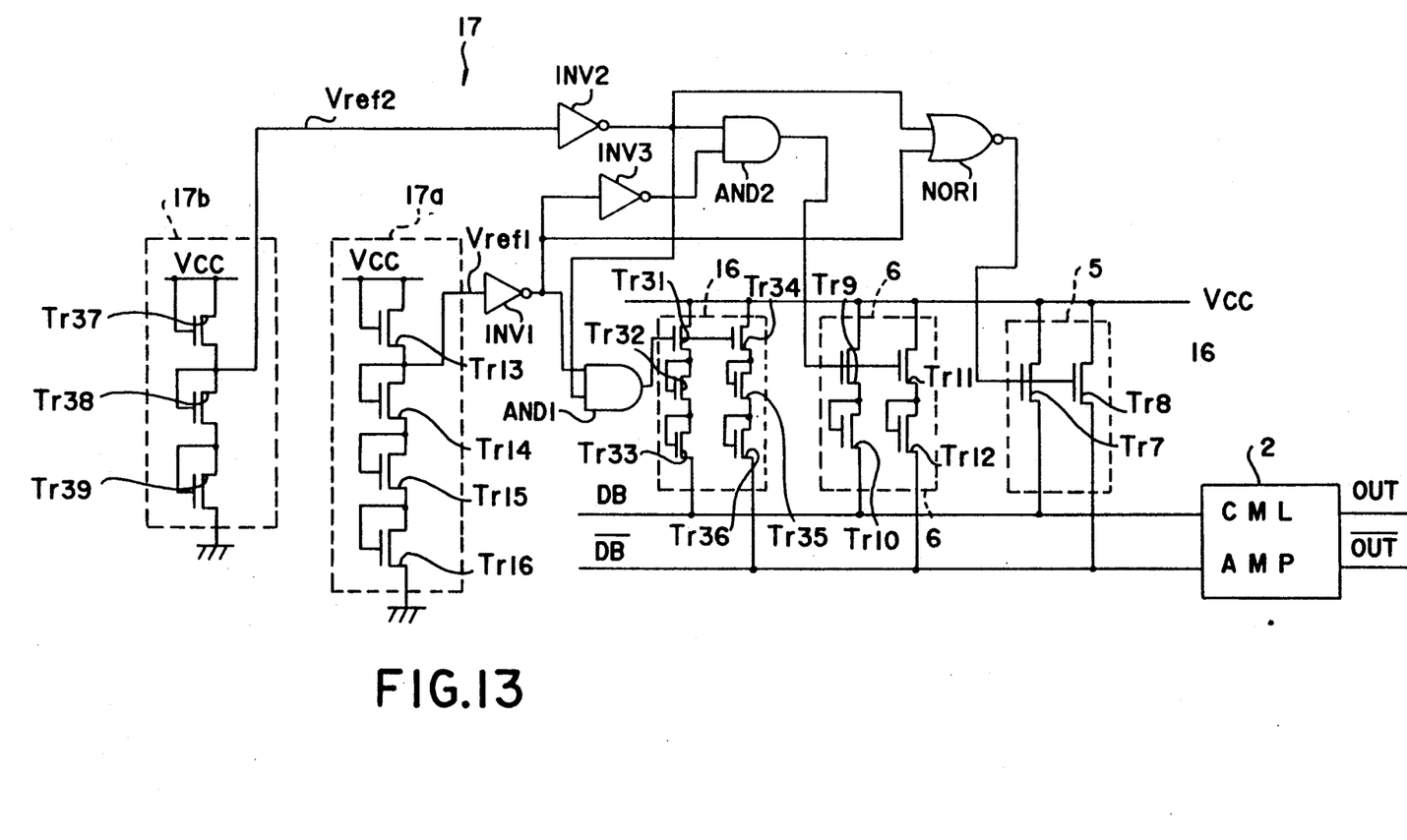
FIG. 13 is a circuit diagram showing another embodiment of the present invention.

FIG. 13 shows another embodiment of the semiconductor memory device of the present invention, wherein more than two limiter circuits are employed.

Referring to FIG. 13, another limiter circuit 16 is provided in addition to the limiter circuits 5 and 6, wherein the limiter circuit 16 includes three transistors Tr31–Tr33 connected in series between the supply voltage Vcc and the bit line DB. Further, the limiter circuit 16 includes three other transistors Tr34–Tr36 connected in series between the supply voltage Vcc and the bit line $\overline{DB}$. Further, a selector circuit 17 is provided in place of the selector circuit 7, wherein the circuit 17 includes a first reference voltage generation part 17a and a second reference voltage generation part 17b. The first part 17a has a construction identical with the selector circuit 7 of FIG. 8 and includes the transistors Tr13–Tr16 connected in series. Thereby, the first part 17a produces a first reference voltage Vref1 that has the value of 3VthN. On the other hand, the second part 17b includes transistors Tr37–Tr39 connected in series. Similar to the first part 17a, each transistor in the second part 17b has the gate and source connected with each other, and produces a second reference voltage Vref2 that has the value of 2VthN.

The first reference voltage Vref1 is supplied to a first input terminal of an AND gate AND1 that drives the transistors Tr31 and Tr34 of the third limiter circuit 16, after a logic inversion in an inverter INV1. Further, the second reference voltage Vref2 is supplied to a second input terminal of the gate AND1 via an inverter INV2. Thus, the first limiter circuit 16 is activated when both inverters INV1 and INV2 produce a high level output simultaneously. This occurs when the supply voltage Vcc is increased and the threshold voltage Vcc/2 of the inverters INV1 and INV2 has exceeded any of the reference voltages Vref1 and Vref2 (Vcc/2>Vref1>Vref2). Thereby, the bus lines DB and $\overline{DB}$ are biased at the level of Vcc−3VthN.

Further, the output of the inverter INV1 is supplied to a first input terminal of an AND gate AND2 via another inverter INV3, and the output of the inverter INV2 is supplied to a second input terminal of the AND gate AND2 directly. Thus, in the foregoing case where the condition Vcc/2>Vref1>Vref2 is met, the AND gate AND2 produces a low level output in response to the low level output of the inverter INV3 and the second limiter circuit 6 is deactivated.

Furthermore, the output of the inverter INV1 and the output of the inverter INV2 are supplied directly to a NOR gate NOR1. Thus, in the foregoing case where both inverters INV1 and INV2 are producing the high level output in correspondence to the condition Vcc/2>Vref1>Vref2, the gate NOR1 produces a low level output and the first limiter circuit 5 is deactivated.

In the case when the supply voltage Vcc is decreased and the inverter INV1 produces a low level output in correspondence to the condition 2Vth <Vcc/2<3Vth, the output of the inverter INV1 changes to low while the output of the inverter INV2 remains high. Thereby, the third limiter circuit 16 is deactivated by the low level output of the AND gate AND1. On the other hand, the second AND gate AND2 produces a high level output and the second limiter circuit 6 is now activated. Thereby, the data bus lines DB and $\overline{DB}$ are biased at the level of Vcc−2VthN. Further, the NOR gate NOR1 produces a low level output and the first limiter circuit 5 is deactivated.

In the case when the supply voltage Vcc is further decreased and both inverters INV1 and INV2 produce a low level output in correspondence to the condition Vcc/2<2Vth<3Vth, the limiter circuits 16 and 6 are both deactivated in response to the low level output of the AND gates AND1 and AND2, while only the first circuit 5 is activated in response to the high level output of the NOR gate NOR1. Thereby, the data bus lines DB and $\overline{DB}$ are biased at the level of Vcc−VthN.

Thus, in the present embodiment, the biasing level of the data bus can be changed in more than two levels in response to the supply voltage Vcc.

Further, the present invention is not limited to the embodiments described heretofore, but various variations and modifications may be made without departing from the scope of the invention.

What is claimed is:

1. A semiconductor memory device, comprising:
   a memory cell array including a plurality of memory cells for storing data;
   data bus means for transferring a data signal read out from the memory cell array;

a current-mirror type amplifier connected to the data bus means for amplifying the data signal, said current-mirror type amplifier being supplied with a power supply voltage; and limiter means connected to the data bus means for limiting a voltage swing of the data signal to a predetermined level, said predetermined level being varied in response to a voltage level of the power supply voltage.

2. A semiconductor memory device as claimed in claim 1 in which said limiter means comprises a plurality of limiter circuits each connected to the data bus means and maintaining the data bus means, when activated, at a predetermined voltage level that is pertinent to the limiter circuit, and selection means supplied with the supply voltage for detecting the voltage level of the supply voltage, said selection means selectively activating one of the limiter circuits in response to the detected level of the supply voltage.

3. A semiconductor memory device as claimed in claim 2 in which said selection means comprises a reference voltage source for producing a constant, reference voltage, comparison means supplied on the one hand with the reference voltage and on the other hand with the supply voltage for producing an output signal such that the output signal has a first logic level when the reference voltage has a level that exceeds the reference voltage, decoding means supplied with the output signal of the comparison means for selectively activating one of the limiter circuits in response to the logic level of the output signal.

4. A semiconductor memory device as claimed in claim 3 in which said reference voltage source comprises a plurality of transistors connected in series to form a circuit having first and second ends, each transistor in the circuit being biased to operate in a turned-on state, wherein said supply voltage is applied across said first and second ends of the circuit.

5. A semiconductor memory device as claimed in claim 3 in which said comparison means comprises a first inverter supplied with the reference voltage for inverting the same, said first inverter being powered by the supply voltage.

6. A semiconductor memory device as claimed in claim 3 in which said decoding means comprises a second inverter supplied with the output signal of the first inverter for inverting the same.

7. A semiconductor memory device as claimed in claim 3 in which said comparison means comprises a current mirror amplifier having first and second current paths each having a first end to which the supply voltage is supplied and a second end connected to the ground, said first current path including first and second MOS transistors connected in series, said first MOS transistor being of one of the P-channel and N-channel types and having a drain connected to the first end, said second MOS transistor being of the other of the P-channel and N-channel types and having a source connected to a drain of the first MOS transistor, said second current path including third and fourth MOS transistors connected in series, said third MOS transistor being of the type the same as the first MOS transistor and having a drain connected to the first end, said fourth MOS transistor being of the type the same as the second MOS transistor, wherein said first MOS transistor and said third MOS transistor having respective gates connected with each other, said third MOS transistor having a source connected to the gate of the first and third MOS transistors, said current mirror amplifier being supplied with the reference voltage at a gate of the second MOS transistor, said current mirror amplifier being further supplied with a voltage having a level proportional to the supply voltage at a gate of the fourth MOS transistor and producing the output signal at the source of the second MOS transistor.

8. A semiconductor memory device as claimed in claim 7 in which said comparison means further includes a voltage divider for dividing the supply voltage, said voltage divider producing the voltage supplied to the gate of the fourth MOS transistor.

9. A semiconductor memory device comprising:
a data bus for transferring a data signal;
a current mirror type amplifier connected to said data bus and supplied with a power supply voltage;
a detection circuit, supplied with said power supply voltage, for generating a control signal on the basis of a voltage level of the power supply voltage; and
a limiter circuit, connected to said data bus and said detection circuit, for limiting a voltage swing of data signal to a predetermined level, which is varied in response to the control signal.

10. A semiconductor memory device as claimed in claim 9 in which said predetermined level is changed high when the power supply voltage is decreased.

11. A semiconductor memory device comprising:
a data bus for transferring a data signal;
a current mirror type amplifier connected to said data bus and supplied with a power supply voltage;
a limiter circuit, connected to said data bus for limiting the voltage level of a data signal on the data bus to a level lower than a predetermined level, said predetermined level being varied in a direction opposite to a direction of variation of the power supply voltage.

* * * * *